(12) United States Patent
Fukada

(10) Patent No.: US 8,895,832 B2
(45) Date of Patent: Nov. 25, 2014

(54) THERMOELECTRIC ELEMENT AND THERMOELECTRIC MODULE

(75) Inventor: Yoshiki Fukada, Susono (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 789 days.

(21) Appl. No.: 12/447,771

(22) PCT Filed: Oct. 31, 2007

(86) PCT No.: PCT/JP2007/071588
§ 371 (c)(1),
(2), (4) Date: Apr. 29, 2009

(87) PCT Pub. No.: WO2008/054015
PCT Pub. Date: May 8, 2008

(65) Prior Publication Data
US 2010/0059096 A1    Mar. 11, 2010

(30) Foreign Application Priority Data

Nov. 2, 2006  (JP) .................................. 2006-299277

(51) Int. Cl.
*H01L 35/00*  (2006.01)
*H01L 35/08*  (2006.01)
*H01L 35/32*  (2006.01)

(52) U.S. Cl.
CPC ................ *H01L 35/32* (2013.01); *H01L 35/08* (2013.01)
USPC ............ 136/205; 136/200; 136/229; 136/242

(58) Field of Classification Search
CPC ................................ H01L 35/08; H01L 35/32
USPC ................................................. 136/200–242
See application file for complete search history.

(56) References Cited

U.S. PATENT DOCUMENTS

| | | | |
|---|---|---|---|
| 3,197,342 A * | 7/1965 | Neild, Jr | 136/210 |
| 3,859,143 A | 1/1975 | Krebs | |
| 4,749,415 A * | 6/1988 | Barton | 136/230 |
| 2002/0024154 A1 | 2/2002 | Hara et al. | |
| 2003/0140957 A1 | 7/2003 | Akiba | |

FOREIGN PATENT DOCUMENTS

| | | |
|---|---|---|
| JP | 2078255 | 3/1990 |
| JP | 3112955 U | 11/1991 |
| JP | 8102554 | 4/1996 |
| JP | 9148634 | 6/1997 |

(Continued)

OTHER PUBLICATIONS

English translation of JP-2001-320096. Publication Date: Nov. 16, 2001.*

*Primary Examiner* — Thanh-Truc Trinh
(74) *Attorney, Agent, or Firm* — Gifford, Krass, Sprinkle, Anderson & Citkowski, P.C.

(57) ABSTRACT

The present invention aims at providing a thermoelectric device which can be prevented from being destroyed by thermal stresses, and a thermoelectric module using a plurality of such thermoelectric devices. The thermoelectric device in accordance with the present invention comprises an element for transforming energy between thermal energy and electric energy and a pair of electrodes connected to both end parts of the element, while the element is provided with a stress alleviating part for alleviating a stress caused by a temperature difference between the both end parts. Therefore, when generating electricity by using the thermoelectric device, the stress alleviating part can alleviate the stress caused by the temperature difference between both end parts of the element and restrain the element from being destroyed by the thermal stress.

7 Claims, 13 Drawing Sheets

(56) References Cited

FOREIGN PATENT DOCUMENTS

| | | |
|---|---|---|
| JP | 9321354 | 12/1997 |
| JP | 2001320096 | 11/2001 |
| JP | 2002232028 | 8/2002 |
| JP | 2002320096 A | 10/2002 |
| JP | 2003309294 | 10/2003 |
| JP | 2005302783 | 10/2005 |
| JP | 2005322848 | 11/2005 |
| JP | 2006114793 | 4/2006 |

* cited by examiner

Fig.13 (a)
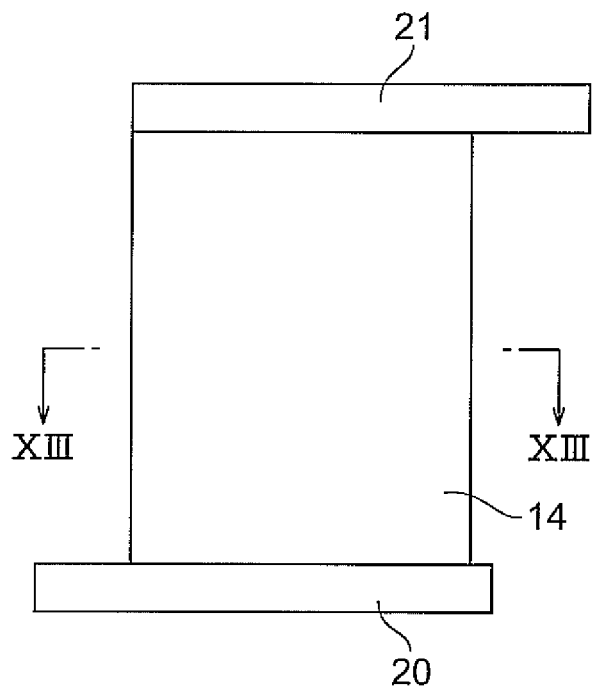
(b)
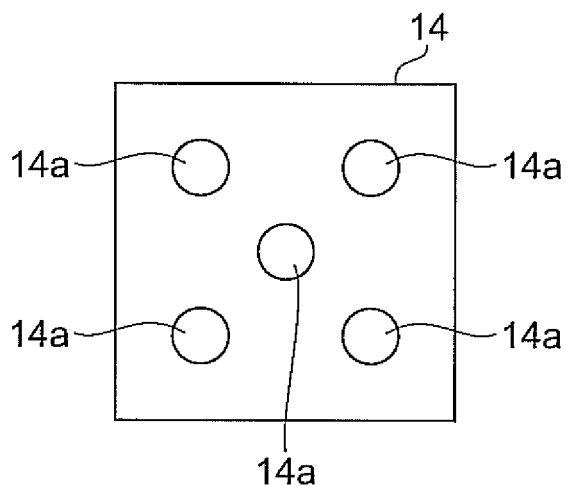
(c)
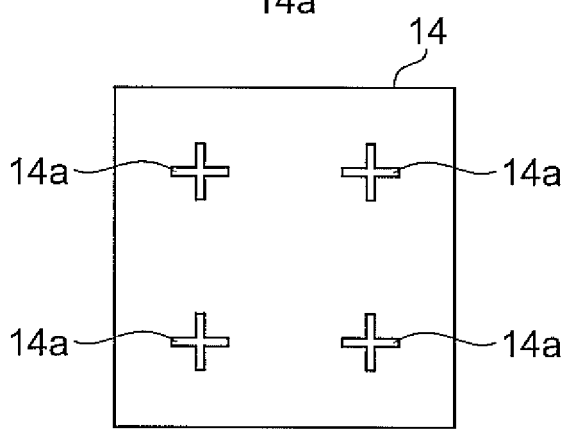

THERMOELECTRIC ELEMENT AND THERMOELECTRIC MODULE

CROSS REFERENCE TO RELATED APPLICATIONS

This application is the U.S. national phase of PCT/JP2007/071588 filed Oct. 31, 2007, which claims priority of Japanese Patent Application 2006-299277 filed Nov. 2, 2006.

TECHNICAL FIELD

The present invention relates to a thermoelectric module which directly transforms energy between thermal energy and electric energy, and a thermoelectric module using a plurality of such thermoelectric devices.

BACKGROUND ART

A thermoelectric module, in which a plurality of two kinds of semiconductor devices (thermoelectric devices) having polarities different from each other adapted to generate a thermoelectromotive force corresponding to a temperature difference according to the Seebeck effect, i.e., N-type thermoelectric devices and P-type thermoelectric devices, are arranged between a heat collecting part on the higher temperature side and a heat dissipating part on the lower temperature side, while end parts of the thermoelectric devices are alternately connected in series through electrodes, can directly transform thermal energy into electric energy (see Japanese Patent Application Laid-Open No. 2005-322848, for example).

DISCLOSURE OF INVENTION

Here, for enhancing the amount of electricity generated by the thermoelectric module, it will be preferred if the device length (height) of the terminal electrode devices is made shorter so as to increase the amount of heat flowing through the thermoelectric devices. When a thermoelectric device having a smaller aspect ratio (ratio between the height and width of the device) is used in order to increase the amount of electricity generated, however, the thermoelectric device yields a higher rigidity in the width direction, so that a stress caused widthwise in the thermoelectric device by a thermal expansion difference between the higher and lower temperature end parts of the thermoelectric device may destroy the thermoelectric device.

For overcoming the problem mentioned above, it is an object of the present invention to provide a thermoelectric device which can be prevent from being destroyed by thermal stresses, and a thermoelectric module using a plurality of such thermoelectric devices.

Hence, the thermoelectric device in accordance with the present invention comprises an element for transforming energy between thermal energy and electric energy and a pair of electrodes connected to both end parts of the element, wherein the element is provided with a stress alleviating part for alleviating a stress caused by a temperature difference between the both end parts.

When generating electricity by using a thermoelectric device, lower and higher temperatures are rendered to one end part provided with one electrode and the other end part provided with the other electrode, respectively. At this time, the thermoelectric device inflates and shrinks on the higher and lower temperature sides, respectively. As a result, a thermal stress acts on the thermoelectric device. Here, the thermoelectric device in accordance with the present invention is provided with a stress alleviating part for alleviating a stress caused by a temperature difference between both end parts and thus can alleviate the thermal stress caused by the temperature difference between the end parts on the higher and lower temperature sides. This can restrain the thermal stress from destroying the element and improve the amount of electricity generated by using an element having a smaller aspect ratio.

Preferably, in the thermoelectric device in accordance with the present invention, the stress alleviating part is an interstice formed in a direction from the end part to end part of the element.

By forming an interstice in the element in the direction from its end part to end part, this invention makes the element easier to deform in a direction parallel to bonding surfaces between the element and electrodes, whereby the rigidity of the element can be lowered in this direction. This can alleviate the thermal stress caused by the temperature difference between the end parts of the element on the higher and lower temperature sides if any. Therefore, the element can be restrained from being destroyed by the thermal stress, whereby the amount of electricity generated can be improved by using elements having a smaller aspect ratio.

Also, the thermoelectric device in accordance with the present invention comprises an element for transforming energy between thermal energy and electric energy and a pair of electrodes connected to both end parts of the element, wherein at least a part of the element is divided into a plurality of parts in a direction substantially perpendicular to a bonding surface with the electrode.

When generating electricity by using a thermoelectric device, lower and higher temperatures are rendered to one end part provided with one electrode and the other end part provided with the other electrode, respectively. At this time, the thermoelectric device inflates and shrinks on the higher and lower temperature sides, respectively. As a result, a thermal stress acts on the thermoelectric device. Here, by dividing at least a part of the element into a plurality of parts in a direction substantially perpendicular to a bonding surface with the electrode, the thermoelectric device in accordance with the present invention increases the aspect ratio in each of the divisional parts, thereby lowering the rigidity of these parts against bending deformation. Therefore, the thermal stress caused by the temperature difference between both ends of the thermoelectric device can be alleviated by deforming the element. As a result, the element can be prevented from being destroyed by the thermal stress.

Preferably, the element is divided into a plurality of parts by a plurality of slits formed between one electrode and the other electrode.

Preferably, in the thermoelectric device in accordance with the present invention, one end of the plurality of parts coincides with one of the ends of the element. This can reduce the rigidity of an element end part where the thermal stress becomes greater. Therefore, the thermal stress acting on this end part can be alleviated by deforming the element end part. As a result, the element end part can effectively be prevented from being destroyed by the thermal stress.

Here, it will be preferred if each of the plurality of parts has a lateral width set according to a stress occurring in the element and a fracture toughness of the element. When the width of the part is thus set in view of the stress acting on the element and the fracture toughness of the element, strength can be secured against the thermal stress at a junction between the element and electrode, whereby the junction can be prevented from being destroyed.

Preferably, in the thermoelectric device in accordance with the present invention, a junction with at least one of the electrodes is formed with an incision dividing the junction into fine parts finer than the plurality of parts. This can improve the strength of the junction between the element and electrode against the thermal stress, whereby the junction can be prevented from being destroyed.

Preferably, the fine part formed by the incision has a lateral width set according to a stress occurring in the element and a fracture toughness of the element. When the width of the fine part is thus set in view of the stress acting on the element and the fracture toughness of the element, strength can be secured against the thermal stress at a junction between the element and electrode, whereby the junction can be prevented from being destroyed.

Preferably, in the thermoelectric device in accordance with the present invention, the junction of the element divided into the fine parts is filled with an electrically conductive bonding material, so as to bond the element and electrode to each other. This can increase the contact area between the element and electrode at the junction, thereby lowering the electrical resistance of the junction, i.e., the electrical resistance of the thermoelectric device.

On the other hand, a structure in which the junction of the electrode with the element is formed such as to mate with the incision formed in the element, while the element and electrode are joined to each other by mating the junction of the electrode and the incision of the element with each other, can also increase the contact area between the electrode and element at the junction. Hence, this can also reduce the electrical resistance of the junction, i.e., the electrical resistance of the thermoelectric device.

Here, it will be preferred if the lateral width of the fine part is set according to a ratio between an electrical resistance of a bonding interface and an electrical resistivity of the element. Thus setting the width of the fine parts in view of the ratio between the electrical resistance of the bonding interface and the electrical resistivity of the element can more appropriately reduce the electrical resistance of the junction, i.e., the electrical resistance of the thermoelectric device.

Preferably, a bonding part between the element and electrode has a depth set according to the ratio between the electrical resistance of the bonding interface and the electrical resistivity of the element and the lateral width of the fine part. This can set the depth of the bonding part between the element and electrode while taking account of a longitudinal current density distribution of each fine part in the bonding part. Therefore, the electrical resistance at the junction between the element and electrode, i.e., the electrical resistance of the thermoelectric device, can be reduced more effectively.

The thermoelectric module in accordance with the present invention is constructed by connecting a plurality of thermoelectric devices, each being one of the above-mentioned thermoelectric devices. The thermoelectric module in accordance with the present invention is constructed by connecting a plurality of thermoelectric devices each of which is one of the above-mentioned thermoelectric devices, and thus can be prevented from being destroyed by a thermal stress caused by a temperature difference between both ends of the thermoelectric module.

Since the element is provided with the stress alleviating part for alleviating a stress caused by a temperature difference between both end parts, the present invention can alleviate the thermal stress caused by the temperature difference between the end parts on the higher and lower temperature sides. Therefore, the element can be restrained from being destroyed by the thermal stress.

BRIEF DESCRIPTION OF DRAWINGS

FIG. 13 is an explanatory view of the thermoelectric device in accordance with a fourth embodiment.

DESCRIPTION OF EMBODIMENTS

Figure 1:
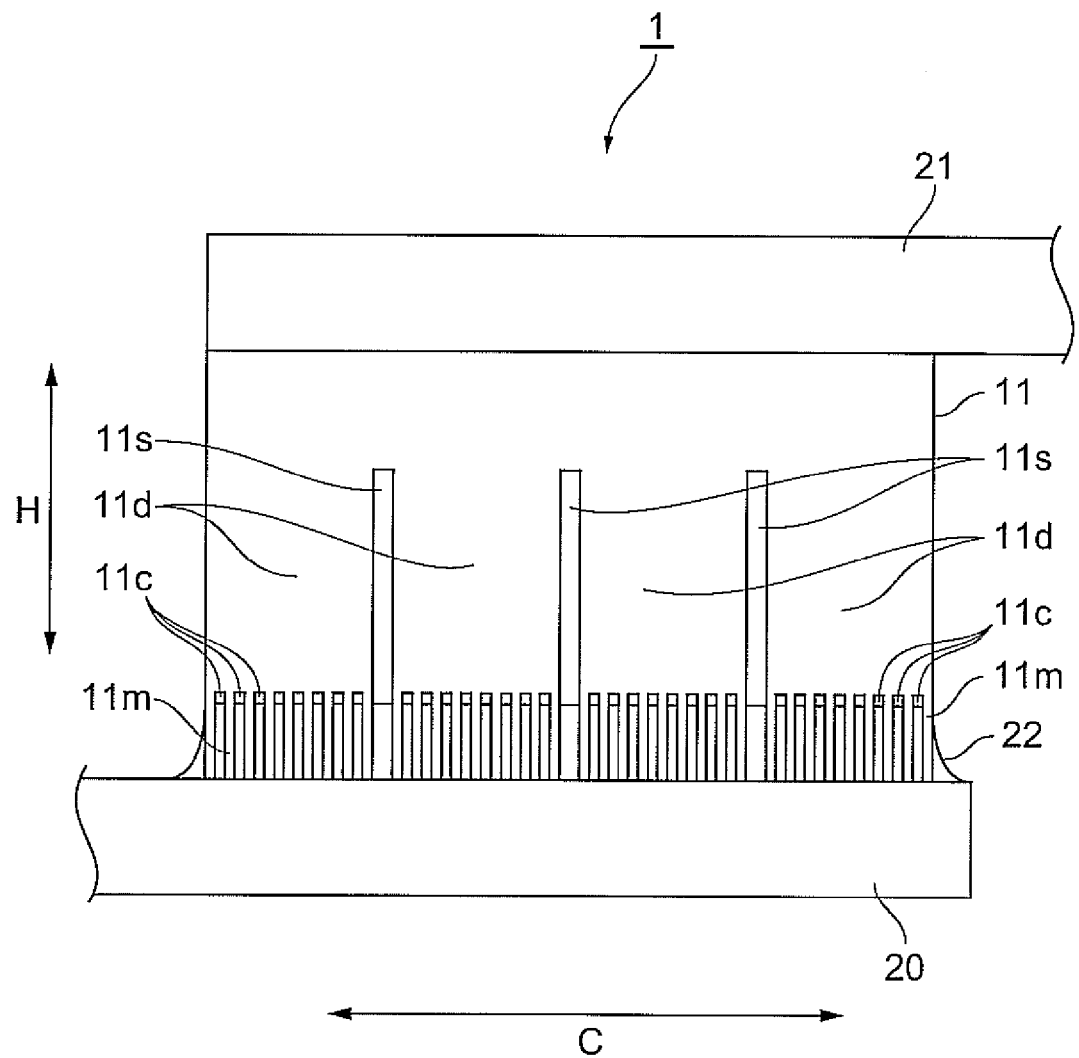
FIG. 1 is a sectional view of the thermoelectric device in accordance with a first embodiment.

In the following, preferred embodiments of the present invention will be explained in detail with reference to the drawings. In the drawings, the same or equivalent parts will be referred to with the same signs.

First Embodiment

To begin with, the structure of the thermoelectric device in accordance with the first embodiment will be explained with reference to FIG. 1. FIG. 1 is a sectional view of the thermoelectric device 1 in accordance with the first embodiment. In the specification, the direction of arrow H illustrated in FIG. 1, i.e., the direction connecting one electrode to the other electrode, is taken as the height direction of the thermoelectric device, while the direction of arrow C, i.e., the direction parallel to the electrodes, is taken as the width direction of the thermoelectric device.

The thermoelectric device 1 comprises a semiconductor element 11 of N or P type which directly transforms energy between thermal energy and electric energy, and a pair of electrodes 20, 21 provided at both end faces of the semiconductor element 11, respectively. The semiconductor element 11 corresponds to the element recited in the claims.

The semiconductor element 11 is an element having a substantially rectangular parallelepiped form. The semiconductor element 11 is formed with a plurality of (3 in the example of FIG. 1) slits 11s in parallel with side faces of the semiconductor element 11 from a bonding surface with one electrode 20 toward a bonding surface with the other electrode 21. One end of each slit 11s reaches the bonding surface of the semiconductor element 11 with one electrode 20. On the other hand, the other end of the slit 11s does not reach the bonding surface of the semiconductor element 11 with the other electrode 21.

The semiconductor element 11 is also formed with similar slits 11s on side faces which are orthogonal to the cross section illustrated in FIG. 1. Hence, the slits 11s are formed like grids when the semiconductor element 11 is seen as a plane. These slits 11s divide a part of the semiconductor element 11 into a plurality of parts (16 (4×4) parts in the example of FIG. 1, which will hereinafter be referred to as "divisional parts") 11d. The number of slits is 3×3 in the example of FIG. 1 but is not limited thereto as a matter of course.

The junction of the semiconductor element 11 with the electrode 20 is also formed with a plurality of incisions 11c which further divide the junction divided by the slits 11s into fine parts 11m which are finer. The incisions 11c are formed in parallel with the slits 11s. In addition, it is appreciated from FIG. 1 that the slits 11s have a longer or greater dimension/length than the incisions 11c. As with the slits 11s, the incisions 11c are also formed on the side faces orthogonal to the cross section illustrated in FIG. 1. Hence, when the semiconductor element 11 is seen as a plane, the incisions 11c are formed into grids finer than those defined by the above-mentioned slits 11s. The number of incisions is determined according to the set width of the fine part 11m. The slits 11s and incisions 11c are interstices formed in a direction from one end part to the other end part of the semiconductor element 11, and function as a stress alleviating part for alleviating a stress caused by a temperature difference between both end parts of the semiconductor element 11.

Figure 2:
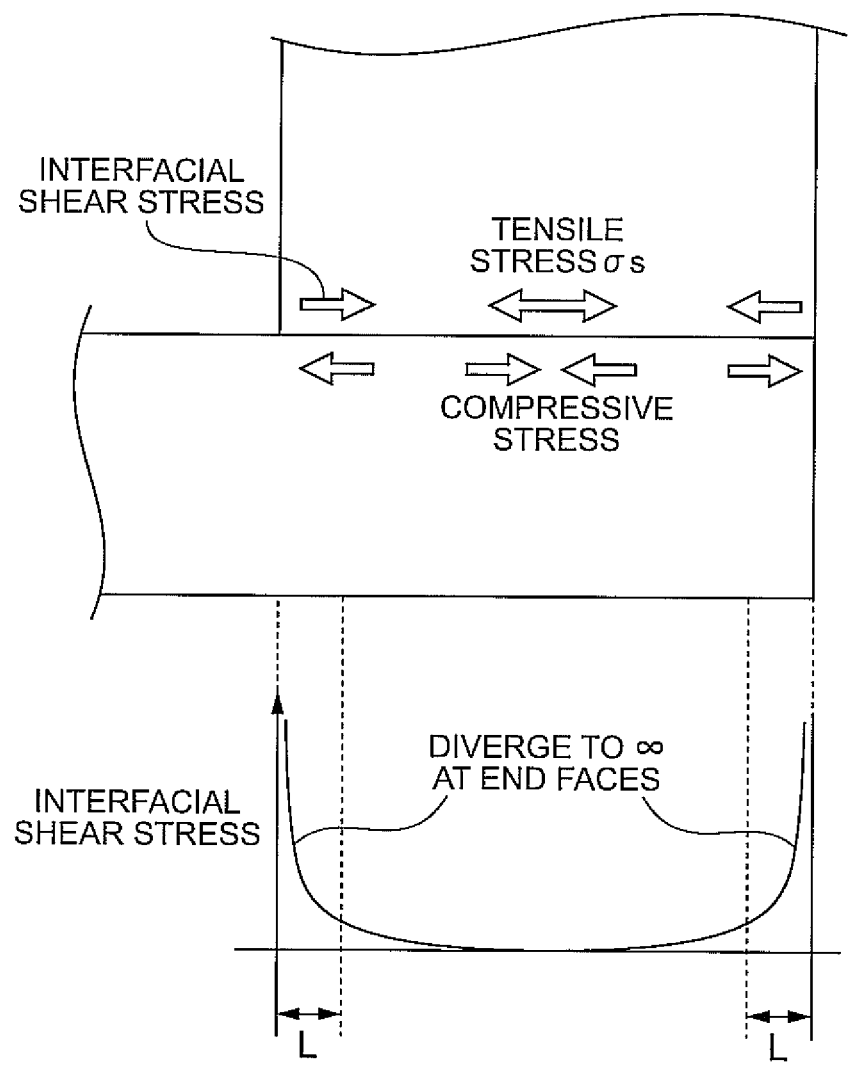
FIG. 2 is a view for explaining a shear stress at an interface between an element and an electrode.
Figure 3:
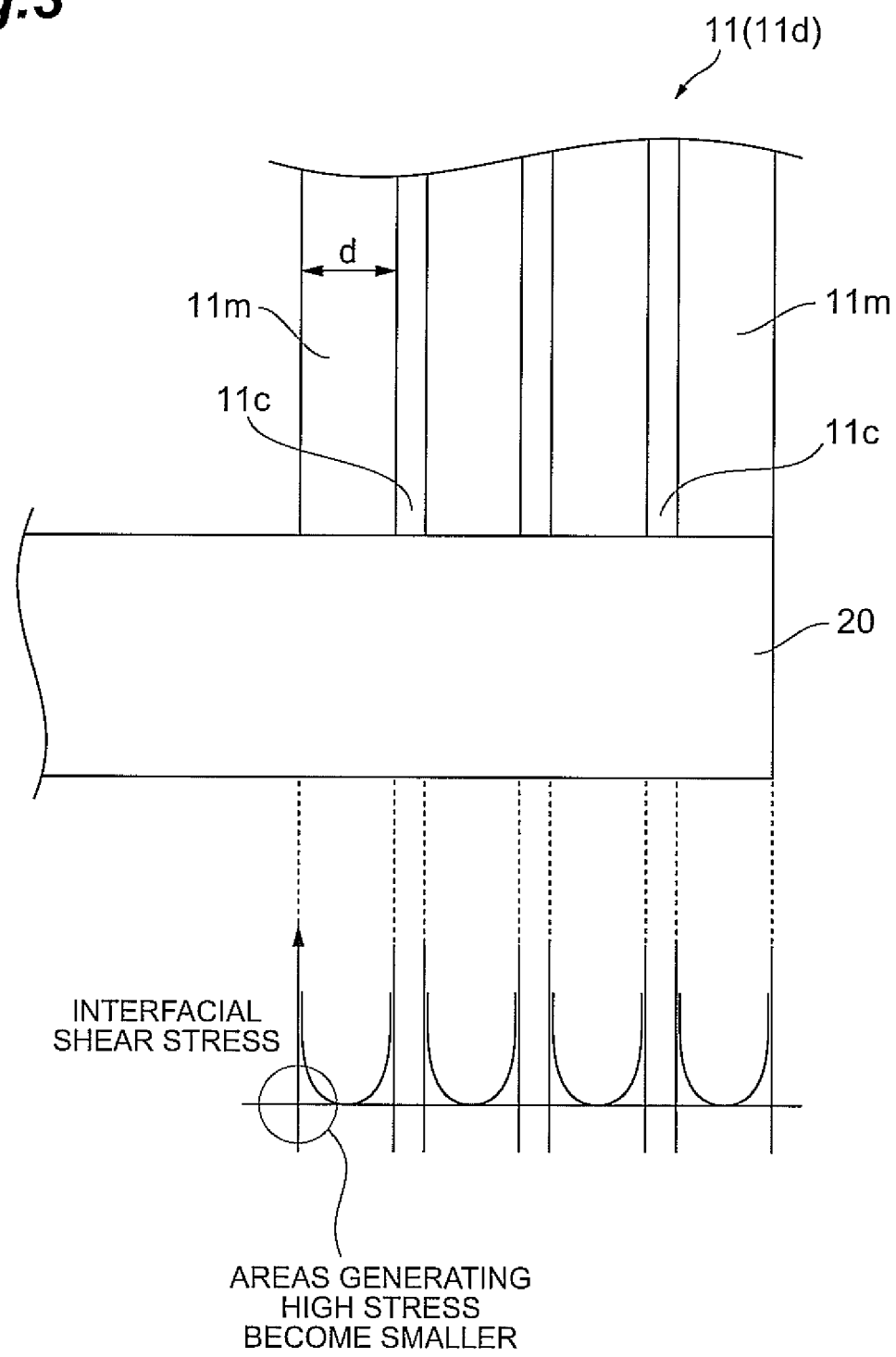
FIG. 3 is a view for explaining a method of setting a width of fine parts.

Therefore, with reference to FIGS. 2 and 3 in combination, a method of setting the width of the fine parts 11m will now be explained. FIG. 2 is a view for explaining a shear stress at an interface between a semiconductor element and an electrode. FIG. 3 is a view for explaining a method of setting the width of the fine parts 11m.

When a semiconductor element and an electrode which have different coefficients of thermal expansion are bonded to each other, a thermal stress is caused by a temperature change in general as illustrated in FIG. 2. The example illustrated in FIG. 2 represents a case where the linear expansion coefficient of the semiconductor element is smaller than that of the electrode, whereby $\Delta T$ is positive (heated state). Here, an average value $\sigma s$ (Pa) of a tensile stress occurring near a center part of a bonding surface of the semiconductor element is determined by the following expression (1):

$$\sigma s=[(\alpha s-\alpha m)\cdot \Delta T\cdot Es]/[1+(Es/Em)] \quad (1)$$

where $\alpha s$ is the coefficient of linear expansion (/° C.) of the semiconductor element, $\alpha m$ is the coefficient of linear expansion (/° C.) of the electrode material, $\Delta T$ is the temperature difference (° C.) from the temperature at the time of bonding, Es is the modulus of elasticity (Pa) of the semiconductor element, and Em is the modulus of elasticity (Pa) of the electrode material.

The tensile stress $\sigma s$ generates an interfacial shear stress diverging to infinity at end parts of the bonding surface of the semiconductor substrate as illustrated in FIG. 2. The value of destruction by the shear stress diverges in a linear theory, so that the destruction occurs in a state with no temperature difference and thus cannot be predicted by a stress theory (a theory that the destruction occurs when the stress exceeds a certain value). However, areas where the stress diverges are limited to small areas in the end parts and thus can be dealt with by fracture mechanics. Therefore, assuming that a stress diverging area in an end part is a microcrack (craze) dealt with by the fracture mechanics, the advancement of a crack in the state where the microcrack is generated in the semiconductor element on which the tensile stress $\sigma s$ acts, i.e., whether it breaks or not, is determined.

According to the fracture mechanics, a condition under which the crack does not advance (break) in the state where a microcrack having a length L (m) is generated in the semiconductor element on which the tensile stress $\sigma s$ acts is represented by the following expression (2):

$$\pi L \sigma s^2 < Kc^2 \quad (2)$$

where Kc is the mode II fracture toughness (Pa·m$^{1/2}$) of the semiconductor element.

From the above-mentioned expressions (1) and (2), the critical value (maximum value) Lc of the crack length L at which the crack does not advance (break), i.e., the above-mentioned expression (2) holds, is determined by the following expression (3):

$$Lc=Kc^2[1+(Ex/Em)^2]/[\pi(\alpha s-\alpha m)^2 \cdot \Delta T^2 \cdot Es^2] \quad (3)$$

Here, physical properties and condition of use ($\Delta T$) of the semiconductor element and electrode material are assumed as follows, for example. That is, it is assumed that Kc=0.4×10$^6$ (Pa·m$^{1/2}$), Es=70×10$^9$ (Pa), Em=100×10$^9$ (Pa), $\alpha s - \alpha m$=4× 10$^{-6}$ (/° C.), and $\Delta T$=300(° C.). In this assumed case, the critical crack length Lc becomes 21×10$^{-6}$ (m) from the above-mentioned expression (3).

Here, the crack length L is a virtual crack length, which clearly fails to exceed the width of the semiconductor element, while an area where the interfacial shear stress becomes higher is supposed to be a crack. Therefore, a bond which does not break even at a high temperature can be achieved when the width of the semiconductor element is not more than about several times that of the critical crack length Lc.

Hence, as illustrated in FIG. 3, the width d of each fine part 11m in the semiconductor element 11 is set such as to become not more than several times that of the critical crack length Lc in this embodiment.

Figure 4:
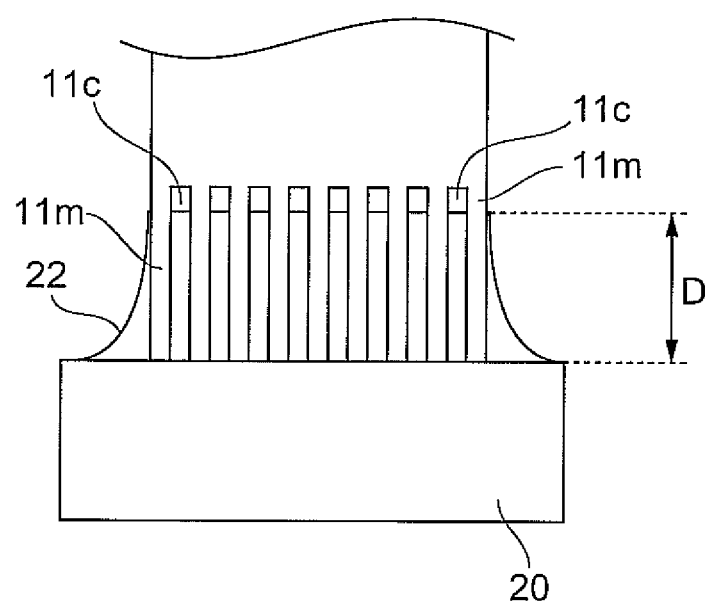
FIG. 4 is a sectional view illustrating a junction between the element and electrode.

With reference to FIG. 4, structures of respective junctions between the semiconductor element 11 and the electrodes 20, 21 will be explained in terms of the junction between the semiconductor element 11 and one electrode 20 by way of example. FIG. 4 is a sectional view illustrating the junction between the semiconductor element 11 and one electrode 20 under magnification. As illustrated in FIG. 4, the semiconductor element 11 and the electrode 20 are bonded to each other by so-called brazing. More specifically, a molten bonding material (brazing material) 22 is caused to flow into and fill the gaps between the fine parts 11m of the semiconductor element 11 and the electrode 20, whereby the semiconductor element 11 and the electrode 20 are bonded to each other.

Figure 5:
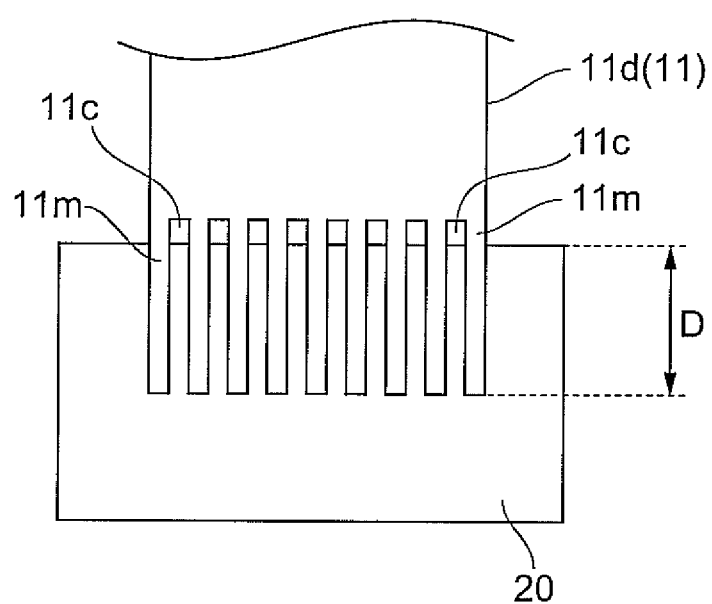
FIG. 5 is a sectional view illustrating another example of the junction between the element and electrode.

FIG. 5 illustrates another preferred structural example of the junction between the fine parts 11m of the semiconductor element 11 and the electrode 20. In this structure, the junction of the electrode 20 is formed into a comb-shaped cross section such as to mate with the depressions and projections at the junction of the semiconductor element 11 (i.e., the depressions and projections formed by the incisions 11c and fine parts 11m). As the projections and depressions of the junction on the semiconductor element 11 side mate with the depressions and projections of the junction on the electrode 20 side, the semiconductor element 11 and the electrode 20 are connected to each other.

From the viewpoint of reducing the electrical resistance at the junction between the semiconductor element 11 and electrode 20, the width d of each fine part 11m and the connecting depth D (see FIGS. 4 and 5) between the fine parts 11m and electrode 20 are set such as to satisfy the following expressions (4) and (5), respectively:

$$d << \delta/\sigma \quad (4)$$

$$D \geq (\delta \cdot d/\sigma)^{1/2} \quad (5)$$

where δ is the electrical resistance (Ω·m²) of the bonding interface (electrical resistance per area of the bonding surface), and σ is the electrical resistivity (volume resistivity) (Ω·m) of the semiconductor element 11.

Figure 6:
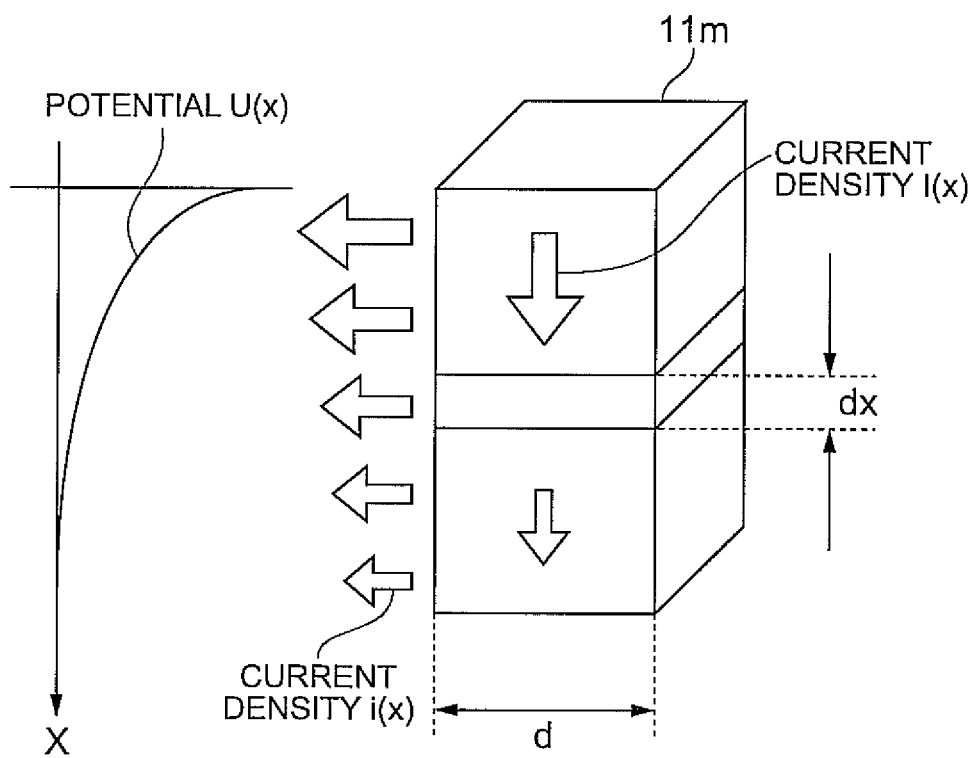
FIG. 6 is a view for explaining a potential gradient and a current density distribution in a longitudinal direction of the fine part at the junction between the element and electrode.

Grounds for the above-mentioned expressions (4) and (5) will now be explained in detail with reference to FIG. 6. FIG. 6 is a view (current analysis model) for explaining the potential gradient and current density distribution of the fine part 11m at the junction between the semiconductor element 11 and electrode 20.

Assuming that a leading end portion of the fine part 11m formed like a rectangular column is wrapped with the electrode 20 that is a good electrical conductor, the current I flowing through the fine part 11m is defined by the gradient of potential U in the fine part 11m and determined by the following expression (6):

$$I = -(1/\sigma)(dU/dx) \quad (6)$$

On the other hand, the current i flowing from the fine part 11m to the electrode 20 is defined by the potential difference between the potential U of the finer part 11m and the potential of the electrode 20 and the electrical resistance δ of the bonding interface and determined by the following expression (7) when the potential of the electrode 20 is assumed to be zero:

$$i = U/\delta \quad (7)$$

Here, from the charge conservation law, the relationship of the following expression (8) holds between the current I in the fine part 11m and the current i flowing from the fine part 11m to the electrode 20:

$$dI/dx = -i/d \quad (8)$$

From the above-mentioned expressions (7) and (8), the following expression (9) is derived:

$$dI/dx = -U/\delta d \quad (9)$$

Further, from the above-mentioned expressions (6) and (9), the following expression (10) is derived:

$$d^2U/dx^2 = (\sigma/\delta d)U \quad (10)$$

Solving the above-mentioned expression (10) yields the following solutions (the following expressions (11) and (12)):

$$U = U_0 \exp(-k \cdot x) \quad (11)$$

$$k = (\delta d/\sigma)^{1/2} \quad (12)$$

Here, for reducing the interfacial electrical resistance by increasing the contact area between the semiconductor element 11 and electrode 20, it is necessary that k<<d, which condition is the above-mentioned expression (4). Also, the combining depth D between the fine part 11m and electrode 20 is required to be 1/k or greater, from which the above-mentioned expression (5) is derived.

When generating electricity by using the thermoelectric device 1 in the foregoing structure, lower and higher temperatures are rendered to the surfaces on one electrode 20 side and the other electrode 21 side, respectively. At this time, the higher and lower temperature sides inflate and shrink, respectively, so that a thermal stress caused by the thermal expansion difference between the higher and lower temperature sides acts on the thermoelectric device 1.

Figure 7:
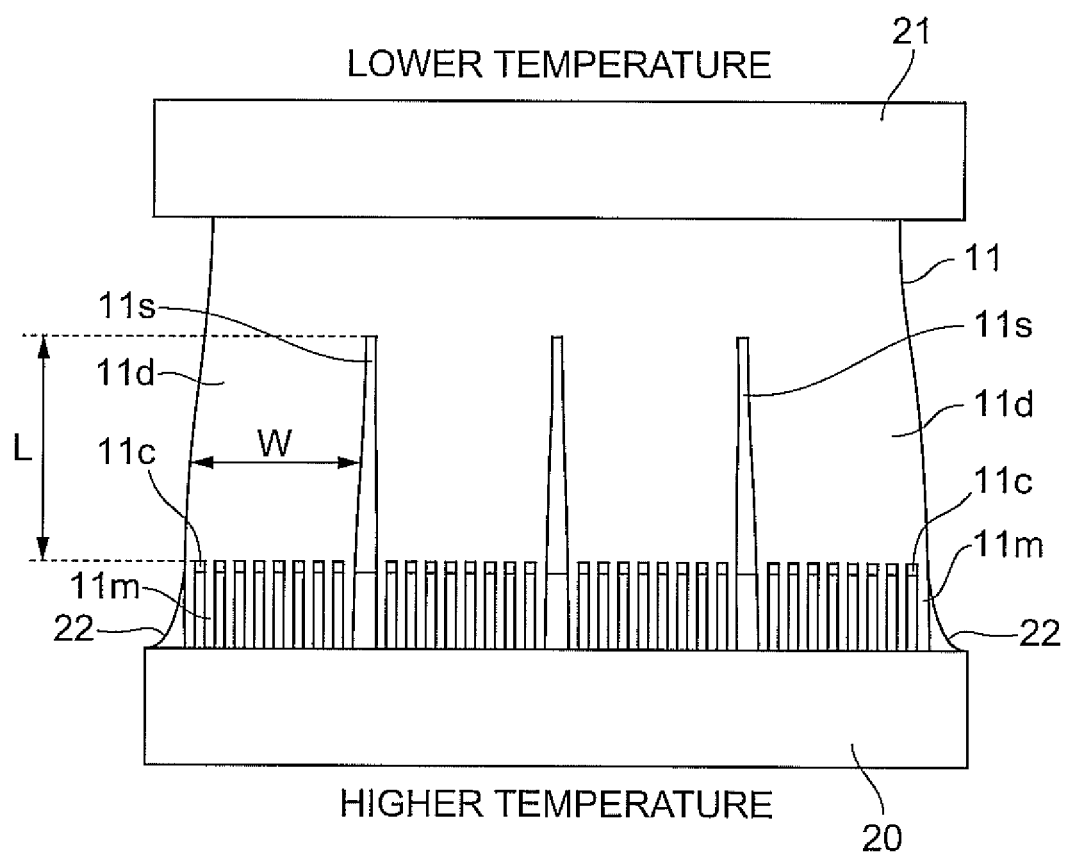
FIG. 7 is a sectional view illustrating a bending deformation caused by a thermal stress acting on the thermoelectric device.

In this embodiment, the semiconductor element 11 constituting the thermoelectric device 1 is divided by the slits 11s into a plurality of divisional parts 11d, so that the divisional parts 11d increase their aspect ratio (height L/width W), whereby the thermoelectric device 1 lowers its widthwise rigidity. Therefore, when the thermal stress caused by the thermal expansion difference between the higher and lower temperature sides acts on the thermoelectric device 1, the thermoelectric device 1 (semiconductor element 11) deforms as a whole as illustrated in FIG. 7.

In this embodiment, the thermoelectric device 1 has an easily deformable structure as such and thus can deform so as to appropriately alleviate the thermal stress caused by the thermal expansion difference. As a result, the thermoelectric device 1 can be prevented from being destroyed by the thermal stress.

Since one end of each slit 11s reaches the bonding surface with the electrode 20, the thermoelectric device 1 in accordance with this embodiment can effectively lower the rigidity at end parts of the semiconductor element 11 where the thermal stress becomes greater. Therefore, by deforming the end parts of the semiconductor element 11, the thermal stress acting on these end parts can appropriately be alleviated. As a result, the thermal stress can effectively be prevented from destroying the end parts of the semiconductor element 11.

When the semiconductor element 11 and electrode 20 having different coefficients of thermal expansion are bonded to each other, a thermal stress will occur if the temperature changes. When the semiconductor element 11 has a coefficient of linear expansion smaller than that of the electrode 20, while the electrode 20 is heated, a tensile stress acts near the center part of the bonding surface of the semiconductor element 11, thereby generating a shear stress at end parts of the bonding surface of the semiconductor element 11.

In the thermoelectric device 1 in accordance with this embodiment, the junction of the semiconductor element 11 with the electrode 20 is divided by a plurality of incisions 11c into the fine parts 11m, while the width d of each fine part 11m is set such as to become not more than several times that of the critical crack length Lc defined according to the tensile stress acting on the semiconductor element 11 and the fracture toughness of the semiconductor element 11. Therefore, strength can be secured against the thermal stress at the junction between the semiconductor element 11 and electrode 20, whereby the junction can be prevented from being destroyed even when the semiconductor element 11 and electrode 20 are rigidly bonded to each other, for example.

Since the semiconductor element 11 and electrode 20 are bonded to each other by filling the junction of the semiconductor element 11 divided into the fine parts 11m with an electrically conductive brazing material 22, a large contact area can be attained at the junction between the semiconductor element 11 and electrode 20, whereby the electrical resistance of the junction, i.e., the electrical resistance of the thermoelectric device 1, can be lowered.

Instead of the above-mentioned so-called brazing, the junction of the electrode 20 may be formed into a comb-shaped cross section such as to mate with the depressions and projections of the junction of the semiconductor element 11 (i.e., the depressions and projections formed by the incisions 11c and fine parts 11m), and the depressions and projections of the junction on the semiconductor element 11 side may be mated with the projections and depressions of the junction on the electrode 20 side, so as to connect the semiconductor element 11 and the electrode 20 to each other. Such a structure can also increase the contact area at the junction between the semiconductor element 11 and electrode 20, whereby the electrical resistance at the junction can be reduced.

Since the width d of each fine part 11m is set (such as to satisfy the above-mentioned expression (4)) according to the ratio between the electrical resistance δ of the bonding interface and the electrical resistivity σ of the semiconductor element 11, this embodiment can reduce the electrical resistance at the junction between the semiconductor element 11 and electrode 20, i.e., the electrical resistance of the thermoelectric device 1, more appropriately.

Since the depth D of the bonding part between the semiconductor element 11 and electrode 20 is set (such as to satisfy the above-mentioned expression (5)) according to the ratio between the electrical resistance δ of the bonding interface and the electrical resistivity σ of the semiconductor element 11 and the width d of the fine part 11m, this embodiment can reduce the electrical resistance at the junction between the semiconductor element 11 and electrode 20, i.e., the electrical resistance of the thermoelectric device 1, more effectively.

Second Embodiment

Figure 8:
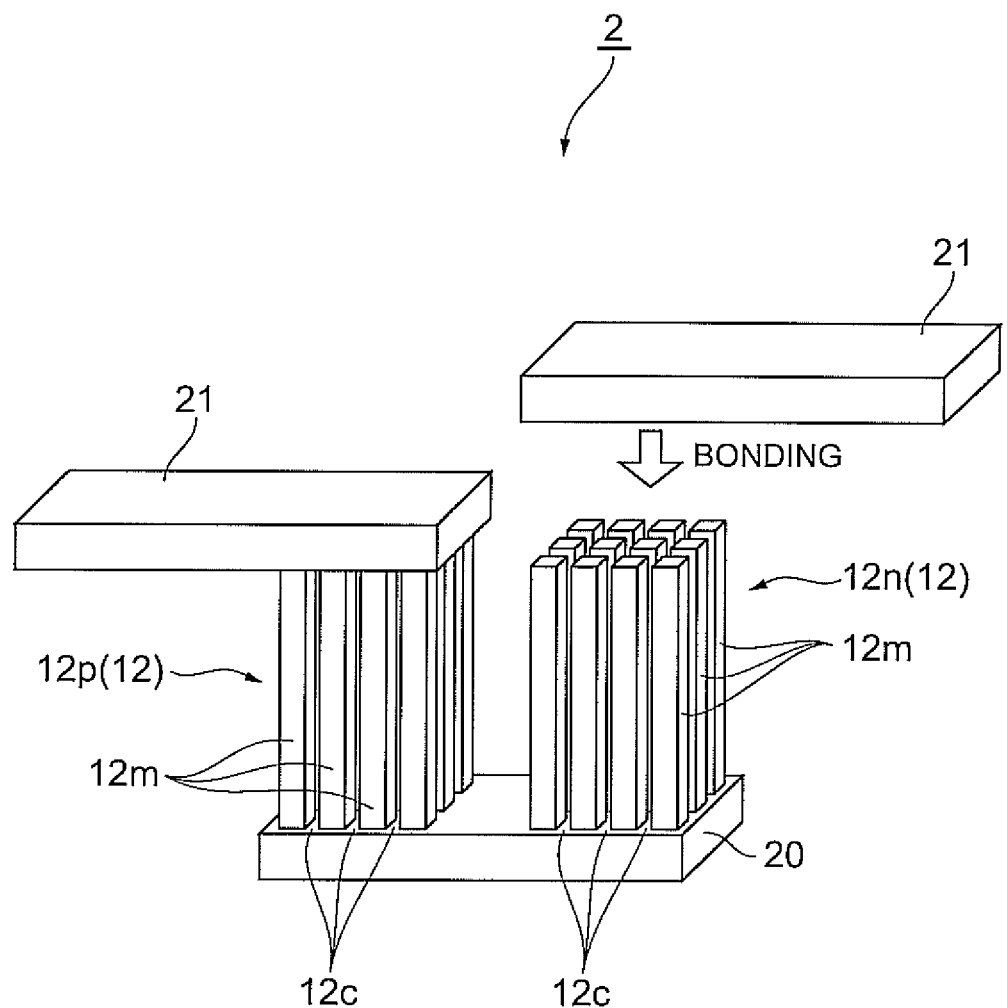
FIG. 8 is a perspective view of the thermoelectric device in accordance with a second embodiment.

While the above-mentioned first embodiment divides the semiconductor element 11 into the relatively large divisional parts 11a with the slits 11s and divides the junction of the semiconductor element 11 with the electrode 20 into the fine parts 11m with the incisions 11c, incisions 12c may be formed so as to extend from a bonding surface with one electrode 20 to a bonding surface with the other electrode 21 as illustrated in FIG. 8 without forming slits, thereby yielding a structure in which a semiconductor element 12 as a whole is split into elongated fine parts 12m, i.e., a structure in which fiber-like semiconductor elements 12m are bundled and joined to the electrodes 20, 21. FIG. 8 is a perspective view of a thermoelectric device 2 in which a pair of N- and P-type semiconductor elements 12n, 12p are connected electrically in series (thermally in parallel) by the electrode 20. In this case, each incision 12c is an interstice formed in a direction from the end part to end part of the semiconductor element 12 and functions as a stress alleviating part for alleviating a stress caused by a temperature difference between both end parts of the semiconductor element 12.

The other configurations, such as the width d of the fine part 12m, method of bonding with the electrodes 20, 21, and the connecting depth D in particular, are identical or similar to those in the above-mentioned first embodiment and thus will not be explained here.

When generating electricity by using the thermoelectric device 2 in the foregoing structure, lower and higher temperatures are rendered to the surfaces on one electrode 20 side and the other electrode 21 side, respectively. At this time, the higher and lower temperature sides inflate and shrink, respectively, so that a thermal stress caused by the thermal expansion difference between the higher and lower temperature sides acts on the thermoelectric device 2.

In this embodiment, the semiconductor elements 12n, 12p constituting the thermoelectric device 2 are divided into a plurality of fine parts 12m, so that the fine parts 12m increase their aspect ratio, whereby the thermoelectric device 2 lowers its widthwise rigidity. Therefore, when the thermal stress caused by the thermal expansion difference between the higher and lower temperature sides acts on the thermoelectric device 2, the thermoelectric device 2 (semiconductor element 12) deforms more easily as a whole.

Thus, this embodiment has a structure which can deform more easily, whereby the thermal stress caused by the thermal expansion difference can be alleviated appropriately by deforming the thermoelectric device 2. As a result, the thermal stress can be prevented from destroying the thermoelectric device 2. In addition, this embodiment can also exhibit effects identical or similar to those of the first embodiment mentioned above.

Third Embodiment

Figure 9:
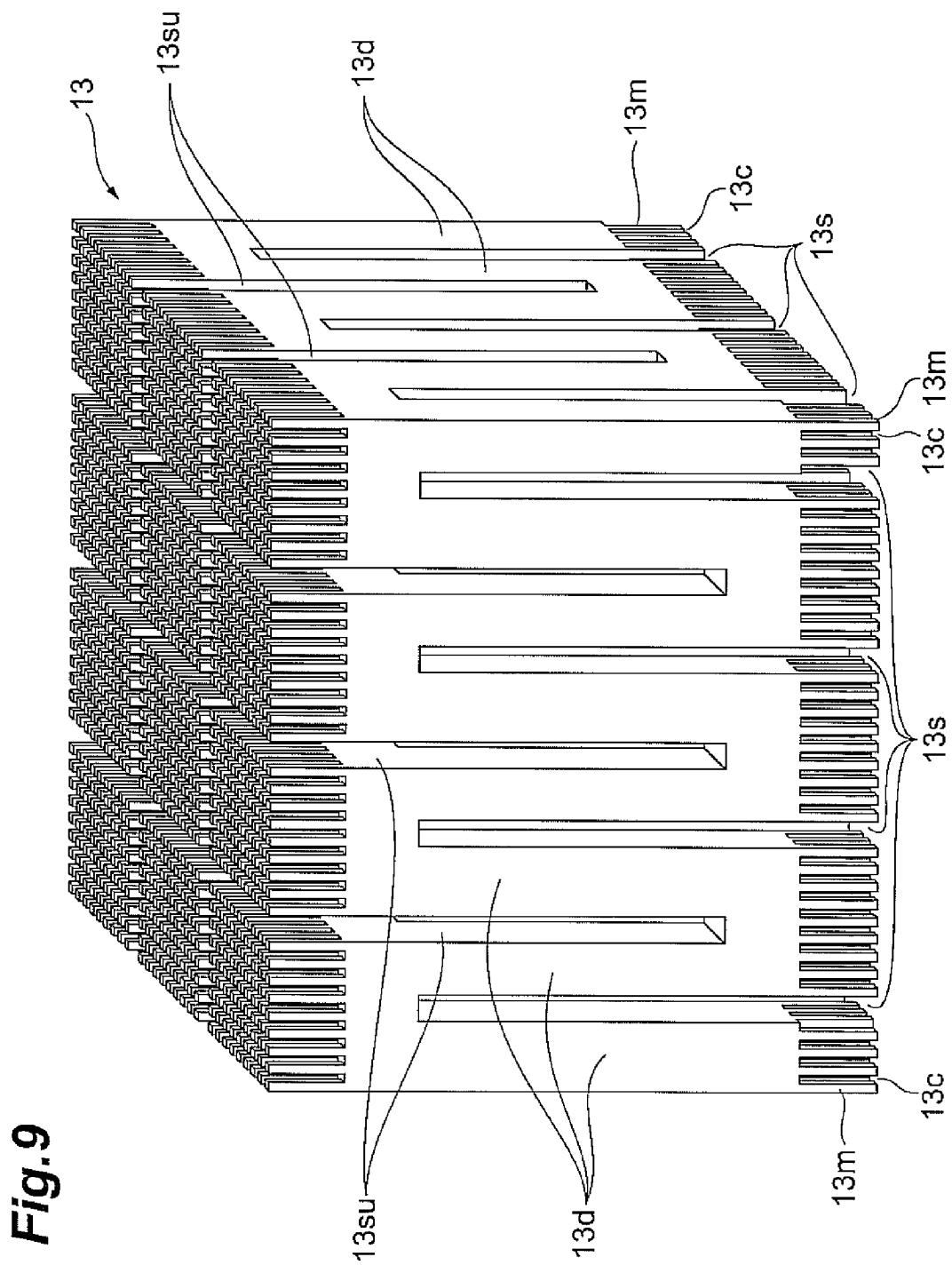
FIG. 9 is a perspective view of a semiconductor element constituting the thermoelectric device in accordance with a third embodiment.
Figure 10:
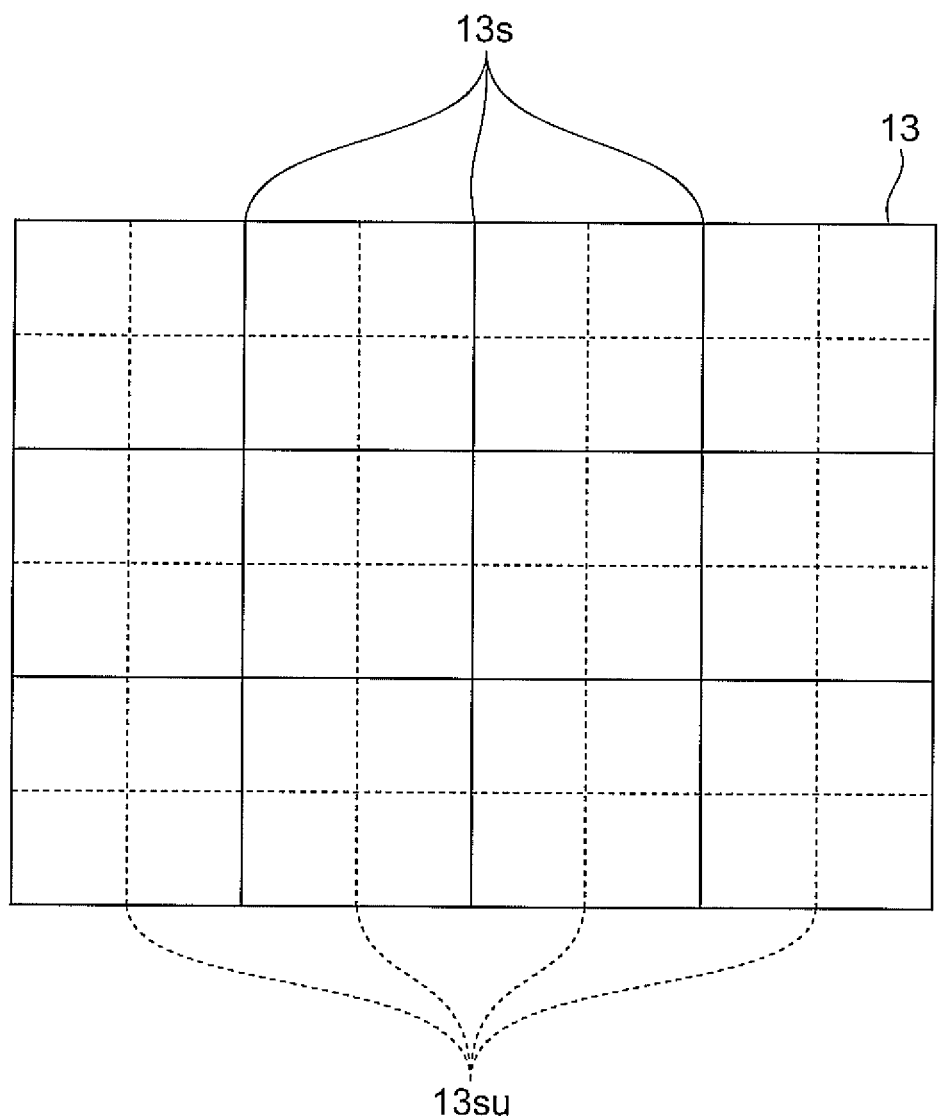
FIG. 10 is a plan view of the semiconductor element illustrated in FIG. 9.

The structure of the thermoelectric device in accordance with the third embodiment will now be explained with reference to FIGS. 9 and 10. FIG. 9 is a perspective view of a semiconductor element 13 constituting the thermoelectric device in accordance with the third embodiment. FIG. 10 is a plan view of the semiconductor element 13 illustrated in FIG. 9 for explaining a method of forming slits.

As illustrated in FIG. 9, the thermoelectric device in accordance with this embodiment differs from the above-mentioned first embodiment in that not only a plurality of slits 13s extending from a bonding surface with one electrode (not depicted) toward a bonding surface with the other electrode (not depicted) but also a plurality of slits 13su extending from the bonding surface with the other electrode (not depicted) toward the bonding surface with one electrode (not depicted) are formed in the semiconductor element 13 constituting the thermoelectric device. In this case, each of the slits 13su is an interstice formed in a direction from the end part to end part of the semiconductor element 13, and functions as a stress alleviating part for alleviating a stress caused by a temperature difference between both end parts of the semiconductor element 13.

Here, as illustrated in FIG. 10, the grids defined by the slits 13s (see solid lines of FIG. 10) and the grids defined by the slits 13su (see broken lines of FIG. 10) are alternately arranged such as to shift from each other by a half grid width in horizontal and vertical directions when the semiconductor element 13 is seen as a plane. Hence, they are arranged such as to exhibit an interdigital structure when seen from side faces.

The thermoelectric device in accordance with this embodiment also differs from the above-mentioned first embodiment in that the junction of the semiconductor element 13 with the other electrode is formed with a plurality of incisions 13c by which the junction divided into a plurality of divisional parts 13d by the above-mentioned slits 13su is further divided into fine parts 13m which are finer. The other configurations are identical or similar to those of the above-mentioned first embodiment and thus will not be explained here.

When generating electricity by using the thermoelectric device in accordance with this embodiment in the foregoing structure, lower and higher temperatures are rendered to the surfaces on one electrode side and the other electrode side, respectively. At this time, the higher and lower temperature sides inflate and shrink, respectively, so that a thermal stress caused by the thermal expansion difference between the higher and lower temperature sides acts on the thermoelectric device.

In this embodiment, the slits 13s, 13su alternately formed from both end faces of the semiconductor element 13 constituting the thermoelectric device yield a greater aspect ratio in each divisional part 13d and a lower widthwise rigidity in the thermoelectric device. Therefore, when the thermal stress caused by the thermal expansion difference between the higher and lower temperature sides acts on the thermoelectric device, the thermoelectric device deforms more easily as a whole.

Thus, by alternately forming the slits 13s, 13su from both end faces, this embodiment allows each divisional part 13d to attain a greater aspect ratio, while preventing the divisional parts 13d from being separated from each other. This can lower the rigidity of the thermoelectric device more effectively without relatively complicating the process of manufacturing the thermoelectric device and the like. As a result, the thermal stress caused by the thermal expansion difference can appropriately be alleviated by deforming the thermoelectric device, whereby the thermoelectric device can be prevented from being destroyed by the thermal stress.

Since not only the junction with one electrode but also the junction with the other electrode is divided into the fine parts 13m, the strength of the latter junction can also be enhanced. In addition, this embodiment can also exhibit effects identical or similar to those of the first embodiment mentioned above.

Figure 11:
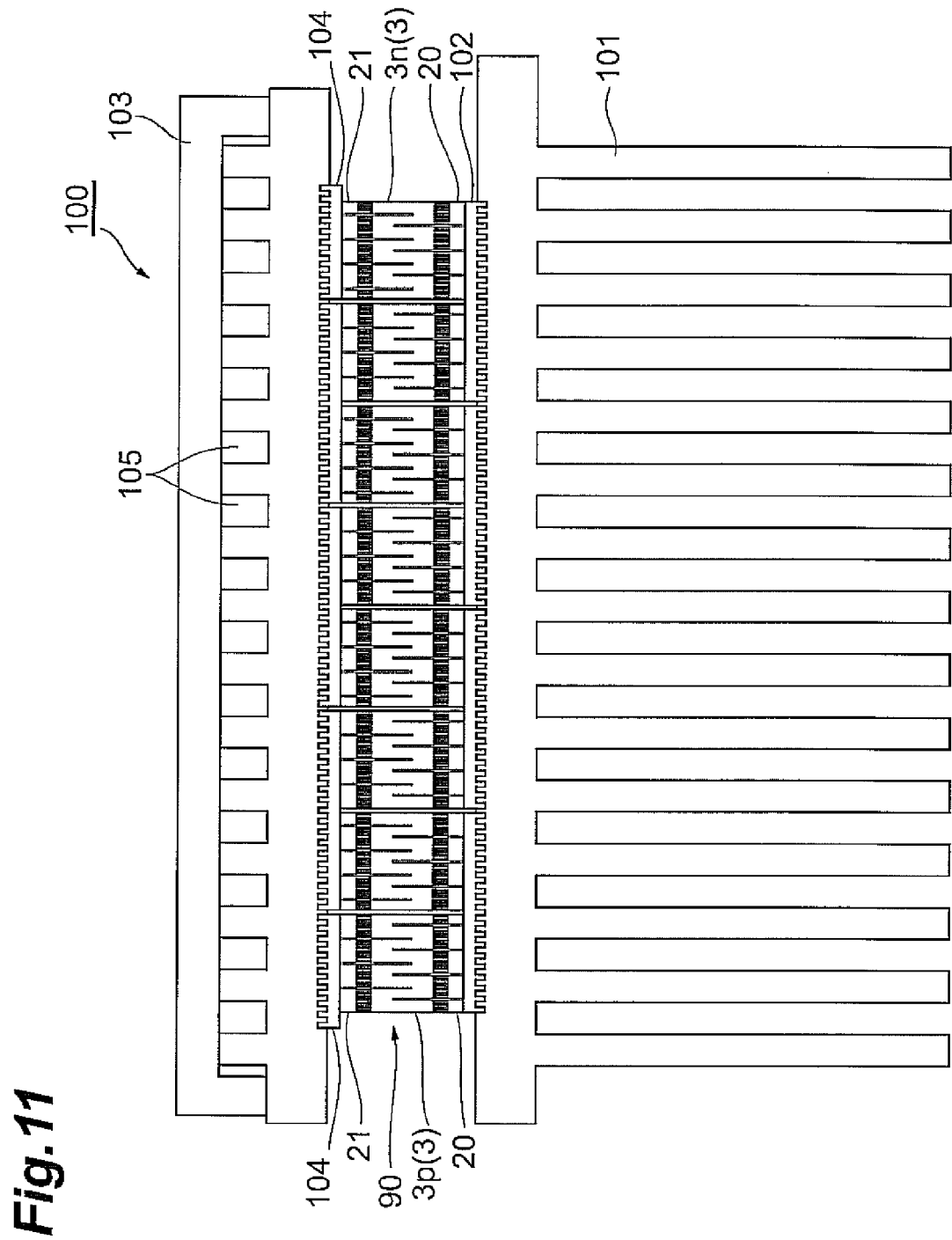
FIG. 11 is a sectional view of a thermoelectric power generating apparatus equipped with a thermoelectric module constructed by the thermoelectric device in accordance with the third embodiment.
Figure 12:
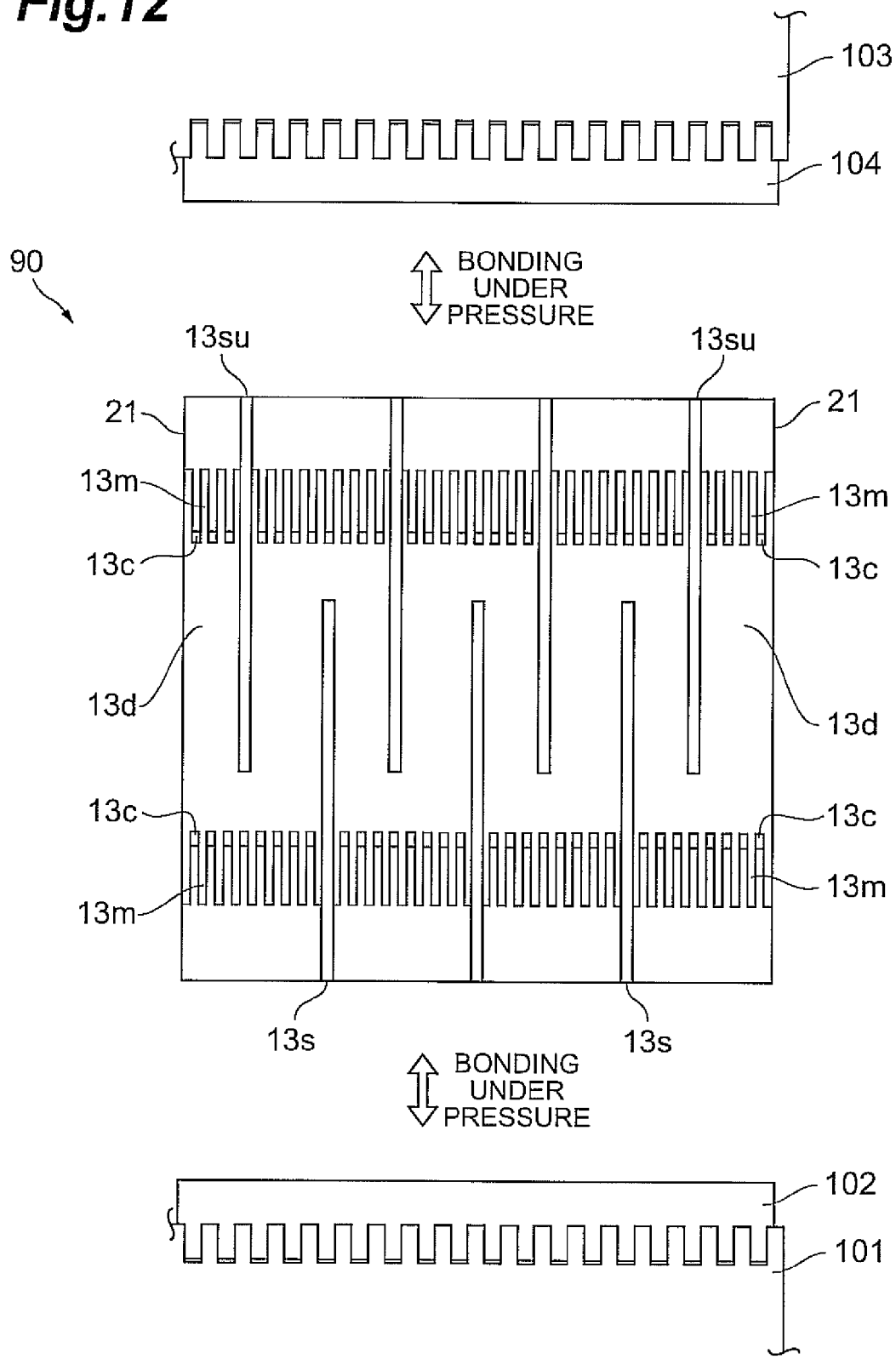
FIG. 12 is a sectional view of a main part for illustrating a method of bonding the thermoelectric device to an electrode on a heat transfer fin side and an electrode on a module cooling member side in the thermoelectric power generating apparatus illustrated in FIG. 11.

With reference to FIGS. 11 and 12, the structure of a thermoelectric module 90 constructed by connecting a plurality of thermoelectric devices 3 in accordance with the third embodiment will now be explained. FIG. 11 is a sectional view of a thermoelectric power generating apparatus 100 equipped with the thermoelectric module 90 constructed by the thermoelectric devices 3 in accordance with the third embodiment. FIG. 12 is a sectional view of a main part for illustrating a method of bonding the thermoelectric device 3 to an electrode 102 on a heat transfer fin side and an electrode 104 on a module cooling member side in the thermoelectric power generating apparatus 100 illustrated in FIG. 11.

As illustrated in FIG. 11, the thermoelectric module 90 in which the N- and P-type thermoelectric devices 3n, 3p are alternately connected in series through the electrodes 20, 21 in accordance with the third embodiment is arranged between a heat transfer fin 101 made of an insulating ceramic constituting a heat receiving part on the higher temperature side and a module cooling member 103 made of an insulating ceramic constituting a heat dissipating part on the lower temperature side, so as to construct the thermoelectric power generating apparatus 100. Also, a plurality of coolant passages 105 are formed in the module cooling member 103. A coolant pipe (not depicted) is connected to the coolant passages 105, whereby the module cooling member 103 is cooled by a coolant fed thereto in a circulating manner.

The electrode 102 on the heat transfer fin side is attached to the junction of the heat transfer fin 101 with the thermoelectric module 90. Each of the heat transfer fin 101 and the electrode 102 on the heat transfer fin side is formed with depressions and projections exhibiting a comb-shaped cross section. The depressions and projections on the heat transfer fin 101 side are mated with the projections and depressions of the electrode 102 on the heat transfer fin side, whereby the heat transfer fin 101 and the electrode 102 on the heat transfer fin side are connected to each other.

The electrode 104 on the module cooling member side is attached to the junction of the module cooling member 103 with the thermoelectric module 90. Each of the module cooling member 103 and the electrode 104 on the module cooling member side is formed with depressions and projections exhibiting a comb-shaped cross section. The depressions and projections on the module cooling member 103 side are mated with the projections and depressions of the electrode 104 on the module cooling member side, whereby the module cooling member 103 and the electrode 104 on the module cooling member side are connected to each other.

Further, as illustrated in FIG. 12, the thermoelectric module 90 is connected to each of the electrode 102 on the heat transfer fin side and the electrode 104 on the module cooling member side by bonding under pressure at a high temperature.

The thermoelectric power generating apparatus 100 having such a structure in accordance with this embodiment is placed such that the heat transfer fin 101 faces an exhaust gas flow path so as to generate electricity by collecting the heat of an exhaust system of an automobile, for example. The heat of the exhaust gas collected by the heat transfer fin 101 is transferred to the electrode 20 at one end of the thermoelectric module 90 through the electrode 102 on the heat transfer fin side, and then is dissipated from the electrode 21 at the other end of the thermoelectric module 90 to the module cooling member 103 through the electrode 104 on the module cooling member side, whereby a plurality of N- and P-type thermoelectric devices 3n, 3p constituting the thermoelectric module 90 generate an electromotive force, thereby yielding electricity.

The thermoelectric module 90 in accordance with this embodiment is constructed by the thermoelectric devices 3 in accordance with the above-mentioned third embodiment and thus can be prevented from being destroyed by the thermal stress caused by the temperature difference between both ends of the thermoelectric module 90

The thermoelectric module 90 can also endure thermal stresses caused by differences in coefficients of thermal expansion among the electrode 20, the electrode 102 on the heat transfer fin side, and the heat transfer fin 101 and thermal stresses caused by differences in coefficients of thermal expansion among the electrode 21, the electrode 104 on the module cooling member side, and the module cooling member 103.

Fourth Embodiment

The structure of the thermoelectric device in accordance with the fourth embodiment will now be explained. FIG. 13(a) is a front view of the thermoelectric device in accordance with the fourth embodiment, whereas FIGS. 13(b) and 13(c) are sectional views of a semiconductor element taken along the line XIII-XIII of FIG. 13(a).

As illustrated in FIG. 13, the thermoelectric device in accordance with this embodiment is one in which a semiconductor element 14 constituting a thermoelectric device is formed with interstices 14a oriented in a direction from its end part to end part. The interstices 14a function as a stress alleviating part for alleviating a stress caused by a temperature difference between both end parts of the semiconductor element 14.

When generating electricity by using a thermoelectric device, lower and higher temperatures are rendered to one end part provided with one electrode and the other end part provided with the other electrode, respectively. At this time, the semiconductor element 14 inflates and shrinks on the higher and lower temperature sides, respectively. As a result, a thermal stress acts on the semiconductor element 14. By contrast, forming the interstices 14a makes the semiconductor element 14 easier to deform in a direction parallel to the bonding surfaces of the semiconductor element 14 with the electrodes 20, 21, whereby the rigidity of the semiconductor element 14 in this direction can be lowered. This can alleviate the thermal stress caused by a temperature difference between the end parts on the higher and lower temperature sides of the semiconductor element 14 if any. Therefore, the thermal stress can be restrained from destroying the semiconductor element 14, whereby the amount of electricity generated can be improved by using the semiconductor element 14 having a smaller aspect ratio.

For example, each interstice 14a has a circular cross section as illustrated in FIG. 13(b). It will be preferred in this case if a plurality of interstices 14a are formed and arranged at predetermined intervals. For example, each interstice 14a has a cross-shaped cross section as illustrated in FIG. 13(c). It will also be preferred in this case if a plurality of interstices 14a are formed and arranged at predetermined intervals.

The interstices 14a may be formed so as to penetrate through the semiconductor element 14 from its end part to end part or extend from one end part to a position falling short of reaching the other end part.

The thermoelectric device in accordance with this embodiment may be formed with the slits and incisions in the other embodiments. It may also be applied to a thermoelectric module as in the third embodiment.

Though the embodiments of the present invention are explained in detail in the foregoing, the present invention can be modified in various ways without being restricted to the above-mentioned embodiments. For example, the other end of each slit 11s does not reach the bonding surface with the other electrode 21 in the above-mentioned first embodiment but may extend to the bonding surface so as to yield a plurality of divisional parts separated from each other.

Forms and materials of the semiconductor elements 11, 12, 13 are not limited to those of the above-mentioned embodiments. For example, the semiconductor elements 11, 12, 13 may be formed like cylindrical columns and the like.

Though the above-mentioned fourth embodiment employs the thermoelectric device 3 in accordance with the third embodiment as the thermoelectric device constituting the thermoelectric module 90, the thermoelectric device 1 in accordance with the first embodiment or the thermoelectric device 2 in accordance with the second embodiment may be used in place of the thermoelectric device 3.

INDUSTRIAL APPLICABILITY

In thermoelectric devices and thermoelectric modules, the present invention can alleviate stresses caused by the temperature difference between both end parts of an element and restrain thermal stresses from destroying the element.

The invention claimed is:

1. A thermoelectric device comprising:
   an element for transforming energy between thermal energy and electric energy; and
   a pair of electrodes connected to both end parts of the element;
      wherein the element is provided with a stress alleviating part for alleviating a stress caused by a temperature difference between the both end parts;
      the stress alleviating part comprising a slit for dividing the element into a plurality of parts and a plurality of incisions for dividing the parts divided by the slit finer into fine parts as an interstice formed in a direction from one end part to the other end part, the slit having a longer dimension than the plurality of incisions;
      a lateral width of the fine parts divided by the incision is set according to a stress occurring on the element and a fracture toughness of the element.

2. The thermoelectric device according to claim 1, wherein one end of the plurality of parts coincides with one of the ends of the element.

3. The thermoelectric device according to claim 2, wherein each of the plurality of parts has a lateral width set according to a stress occurring in the element and a fracture toughness of the element.

4. The thermoelectric device according to claim 1, wherein a junction of the electrode with the element is formed such as to mate with the incision formed in the element, and wherein the element and electrode are joined to each other by mating the junction of the electrode and the incision of the element with each other.

5. The thermoelectric device according to claim 4, wherein the fine part has a lateral width set according to a ratio between an electrical resistance of a bonding interface and an electrical resistivity of the element.

6. The thermoelectric device according to claim 5, wherein a bonding part between the element and electrode has a depth set according to the ratio between an electrical resistance of a bonding interface and the electrical resistivity of the element and the lateral width of the fine part.

7. The thermoelectric device according to claim 1, wherein the fine part has a lateral width d and a connecting depth D that satisfies the expression:

$$D \geq (\delta \cdot d/\sigma)^{1/2}$$

where $\delta$ is an electrical resistance of a bonding surface of the fine part and $\sigma$ is an electrical resistivity of the element.

* * * * *